(12) United States Patent
Yoshida et al.

(10) Patent No.: US 10,951,066 B2
(45) Date of Patent: Mar. 16, 2021

(54) WIRELESS POWER SUPPLY DEVICE AND WIRELESS POWER SUPPLY METHOD

(71) Applicant: NEC CORPORATION, Tokyo (JP)

(72) Inventors: Shuhei Yoshida, Tokyo (JP); Masahiro Tanomura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 74 days.

(21) Appl. No.: 16/332,254

(22) PCT Filed: Sep. 11, 2017

(86) PCT No.: PCT/JP2017/032621
§ 371 (c)(1),
(2) Date: Mar. 11, 2019

(87) PCT Pub. No.: WO2018/051936
PCT Pub. Date: Mar. 22, 2018

(65) Prior Publication Data
US 2019/0207429 A1 Jul. 4, 2019

(30) Foreign Application Priority Data
Sep. 15, 2016 (JP) .............................. JP2016-180211

(51) Int. Cl.
*H02J 50/12* (2016.01)
*H02J 50/40* (2016.01)
(Continued)

(52) U.S. Cl.
CPC ................ *H02J 50/12* (2016.02); *B63G 8/00* (2013.01); *H02J 50/40* (2016.02); *H03H 7/40* (2013.01)

(58) Field of Classification Search
CPC ... B63G 8/00; H03H 7/40; H02J 50/40; H02J 50/12
See application file for complete search history.

(56) References Cited

U.S. PATENT DOCUMENTS

2015/0311880 A1* 10/2015 Yoshida ............... H03H 7/38
307/104
2017/0012600 A1* 1/2017 Obiya ..................... H04L 5/14

FOREIGN PATENT DOCUMENTS

JP 2002-305121 A 10/2002
JP 2010-523030 A 7/2010
(Continued)

OTHER PUBLICATIONS

International Search Report for PCT/JP2017/032621 dated Oct. 3, 2017 [PCT/ISA/210].
(Continued)

*Primary Examiner* — Jared Fureman
*Assistant Examiner* — Duc M Pham
(74) *Attorney, Agent, or Firm* — Sughrue Mion, PLLC

(57) ABSTRACT

In order to facilitate impedance matching even when using a magnetic field antenna for power transmission in a medium, this underwater wireless power supply device 101 wirelessly transmits energy by resonating at a frequency determined by the impedance of a power transmission antenna 103, the impedance of a power receiving antenna 104, and the impedance of a good conductor medium 102. The power transmission antenna 103 and the power receiving antenna 104 have multiple antenna coils 1061, and multiple resonant antenna units 1051 to 1054 having at least one dielectric 1071 arranged between the multiple antenna coils 1061, and, at least one of the multiple resonant antenna units 1051 to 1054 is provided with a load adjustment mechanism 1081 for adjusting the load.

9 Claims, 7 Drawing Sheets

(51) Int. Cl.
*B63G 8/00* (2006.01)
*H03H 7/40* (2006.01)

(56) References Cited

FOREIGN PATENT DOCUMENTS

| | | |
|---|---|---|
| JP | 2018-46668 A | 3/2018 |
| WO | 2012/157115 A1 | 11/2012 |
| WO | 2014/034491 A1 | 3/2014 |
| WO | 2014/119085 A1 | 8/2014 |
| WO | 2014/129531 A1 | 8/2014 |

OTHER PUBLICATIONS

Written Opinion for PCT/JP2017/032621 dated Oct. 3, 2017 [PCT/ISA/237].
Communication dated May 12, 2020 by Japanese Patent office, in application No. 2018-539698.

* cited by examiner

Fig.6

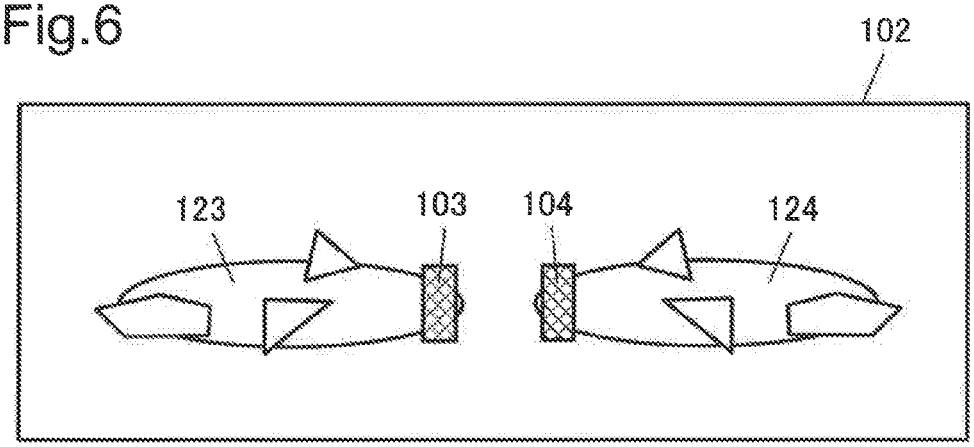

Fig.7

|  | ELECTRIC CONDUCTIVITY (S/m) | RELATIVE PERMITTIVITY |
|---|---|---|
| SEA WATER | APPROXIMATELY 4 | APPROXIMATELY 81 |
| RIVER WATER | APPROXIMATELY $10^{-2} \sim 10^{-1}$ | APPROXIMATELY 81 |
| FRESH WATER, TAP WATER | APPROXIMATELY $10^{-3} \sim 10^{-2}$ | APPROXIMATELY 81 |
| SOIL (WET) | APPROXIMATELY $10^{-2} \sim 10^{-1}$ | APPROXIMATELY $3 \sim 6$ |
| CONCRETE | APPROXIMATELY $10^{-3} \sim 10^{-2}$ | APPROXIMATELY $5 \sim 10$ |
| SOIL (DRY) | APPROXIMATELY $10^{-4} \sim 10^{-3}$ | APPROXIMATELY $3 \sim 6$ |
|  |  |  |
| *AIR | 0 | APPROXIMATELY 1 |

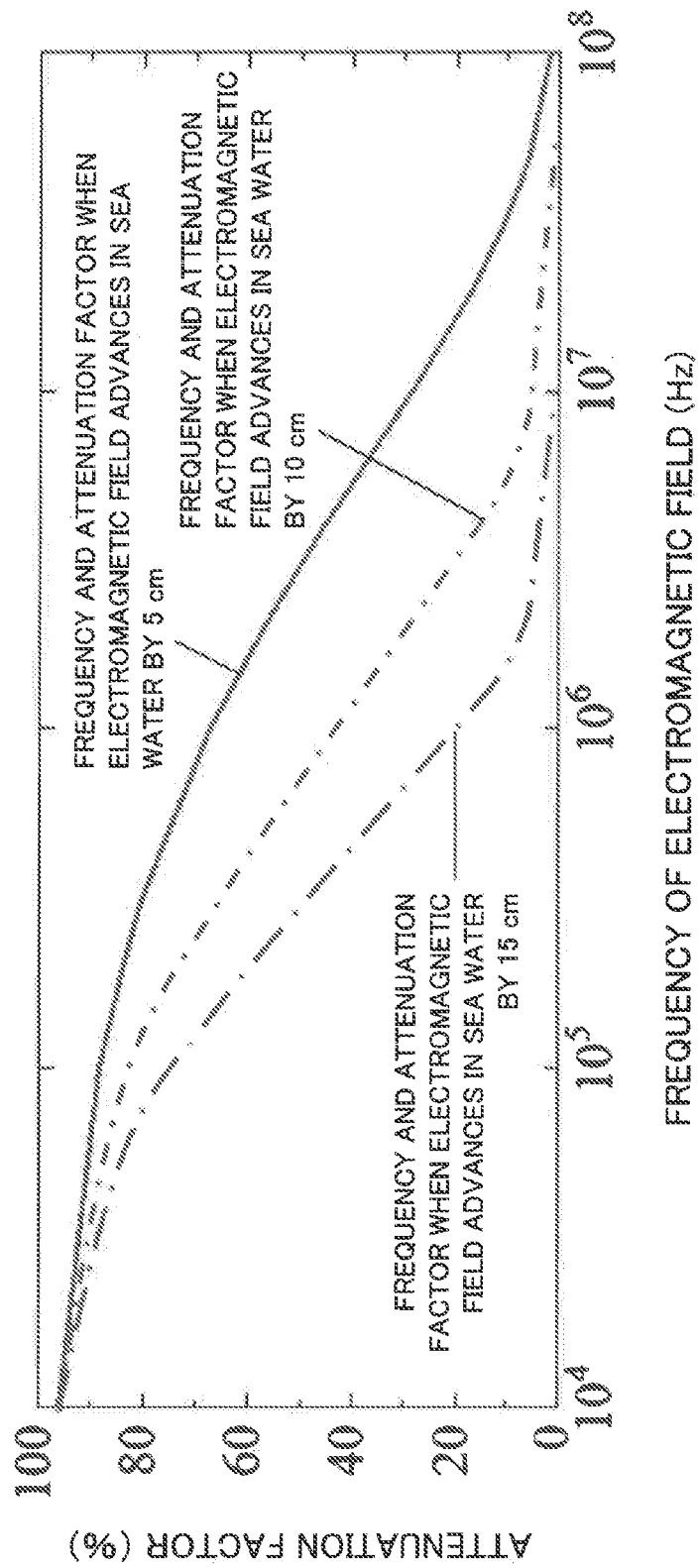

WIRELESS POWER SUPPLY DEVICE AND WIRELESS POWER SUPPLY METHOD

CROSS REFERENCE TO RELATED APPLICATIONS

This application is a National Stage of International Application No. PCT/JP2017/032621, filed on Sep. 11, 2017, which claims priority from Japanese Patent Application No. 2016-180211, filed on Sep. 15, 2016, the contents of all of which are incorporated herein by reference in their entirety.

TECHNICAL FIELD

The present invention relates to a wireless power supply device and a wireless power supply method.

BACKGROUND ART

A technology of transmitting energy wirelessly in a medium such as sea water is disclosed in PTL 1 and PTL 2, for example. In such a technology, a power transmission antenna for transmitting energy and a power receiving antenna for receiving energy are formed of coils obtained by winding lead wires a plurality of times. A magnetic field interlinking across the coils is generated by applying AC power to the coils of the power transmission antenna. The magnetic field interlinks across the coils of the power receiving antenna and generates induced current in the coils of the power receiving antenna, and thereby, power supply is performed.

However, in such a technology, the power transmission antenna and the power receiving antenna can be set away from each other by only approximately 2 cm in distance. Accordingly, with respect to a moving body or a sensor driven in the sea, positioning accuracy of the power transmission antenna is required to be set high. Further, it is difficult to obtain an intended power supply property in a case where a living organism adheres to the antenna. Thus, there is difficulty in supplying power in a stable manner.

When it is possible for the power transmission antenna and the power receiving antenna to be set away from each other by 5 cm or more in order to perform power supply, restriction on positioning accuracy of a moving body driven in the sea and adhesion of a living organism is significantly relieved.

As a result of detailed examination on factors causing insufficient power supply efficiency in the sea in the above-mentioned related art, the following matter is revealed. That is, sea water has electric conductivity higher than that of a medium such as air, and hence eddy current or diffusion current is generated when a magnetic field or an electric field (electromagnetic field) passes through the sea water. Accordingly, loss is caused. Herein, the air has electric conductivity of 0 and relative permittivity of approximately 1, whereas the sea water has electric conductivity of approximately 4 S/m.

Further, as a result of examination on a method for reducing loss of an electromagnetic field passing through the sea water having the above-mentioned high electric conductivity, it is understood that attenuation of the electromagnetic field passing through the sea water is caused proportionally to Expression (1) described below.

$$\exp\left(-\frac{2d}{\sqrt{\pi f \mu \sigma}}\right) \quad (1)$$

In the expression, "d", "f", "μ", and "σ" indicate a distance between the power transmission antenna and the power receiving antenna, a frequency, magnetic permeability of the sea water, and electric conductivity of the sea water, respectively.

FIG. 8 is a graph illustrating, by using Expression (1), a relationship between a frequency and an attenuation factor in a case where the electromagnetic field advances in the sea water.

As apparent from FIG. 8, in order to obtain sufficient transmission efficiency when the power transmission antenna and the power receiving antenna are set away from each other in the sea water by 5 cm or more, for example, antennas that are operated at a low frequency lower than 100 kHz are required. However, an operation frequency of the antenna and a size of the antenna has a trade-off relationship. Hitherto, even in a case where the antennas are small enough to match with a size of a moving body or a sensor in the sea water, and also the power transmission antenna and the power receiving antenna are set away from each other in the sea water by 5 cm or more, it has been difficult to perform power supply with a practical power supply efficiency of several tens percent or more.

A technology for solving this problem is disclosed in PTL 3, for example. A power transmission device disclosed in PTL 3 performs power transmission at high efficiency even in a conductive medium such as sea water by coupling a magnetic field transmitted from the power transmission antenna to the power receiving antenna and resonating at resonant impedance determined by impedance of the medium present between the antennas.

CITATION LIST

Patent Literature

[PTL 1] Japanese Unexamined Patent Application Publication No. 2002-305121
[PTL 2] Japanese Translation of PCT International Application Publication No. 2010-523030
[PTL 3] International Publication No. WO 2014/034491

SUMMARY OF INVENTION

Technical Problem

A loop antenna as disclosed in PTL 3 can generate a time varying induction magnetic field by inputting a high frequency regardless of the loop length, and can emit the magnetic field into a medium. Meanwhile, in general, a physical length of the loop antenna is smaller with respect to a wavelength of a high frequency to be input (smaller than 0.1 wavelength), and the high frequency input in the loop antenna does not generate a standing wave. In the loop antenna, the standing wave is not generated, and hence a voltage does not have a maximal value. Accordingly, input impedance, that is, impedance in the loop antenna viewed from an input end thereof is small.

Further, the input impedance has a value lower than impedance of the air (377Ω) and impedance of the sea water (50Ω). When the impedance of the medium and the impedance of the antenna input end do not match with each other, electric power reflection is caused on an end surface therebetween, and transmission efficiency is reduced.

In order to eliminate the impedance mismatch, there has been proposed a circuit called a matching circuit in which a capacitor, an inductor, and the like are utilized, for example.

However, design for a dedicated circuit is required. Further, at a low frequency band lower than 100 kHz, for example, there arises another problem that the circuit is increased in size.

An object of the present invention is to provide wireless power supply device which can facilitate impedance matching even when a magnetic field antenna is used for power transmission in a medium.

Solution to Problem

A wireless power supply device of the present invention is a wireless power supply device which wirelessly transmits energy by resonating at a frequency determined by impedance of a power transmission antenna configured to wirelessly transmit energy in a medium, impedance of a power receiving antenna configured to receive energy transmitted from the power transmission antenna, and impedance of the medium, wherein each of the power transmission antenna and the power receiving antenna includes a plurality of resonant antenna means including a plurality of antenna coils and at least one dielectric arranged between the plurality of antenna coils, and at least one of the plurality of resonant antenna means includes a load adjustment mechanism configured to adjust a load.

A wireless power supply method of the present invention is a wireless power supply method, in which each of a power transmission antenna configured to wirelessly transmit energy in a medium and a power receiving antenna configured to receive energy transmitted from the power transmission antenna includes a plurality of resonant antenna means including a plurality of antenna coils and at least one dielectric arranged between the plurality of antenna coils. The wireless power supply method comprises: adjusting a load of at least one of the plurality of resonant antenna means; and wirelessly transmitting energy by resonating at a frequency determined by impedance of the power transmission antenna, impedance of the power receiving antenna, and impedance of the medium.

Advantageous Effects of Invention

According to the present invention, even when a magnetic field antenna is used for power transmission in a medium, impedance matching can be facilitated.

BRIEF DESCRIPTION OF DRAWINGS

FIG. 6 is a view for illustrating an outline of an application example to which the present invention is applied.

FIG. 7 is a view for illustrating a table in which electric conductivity and relative permittivity of respective media in the present invention are collectively shown.

FIG. 8 is a graph for showing a relationship between a frequency and an attenuation factor in a case where an electromagnetic field advances in the sea water.

EXAMPLE EMBODIMENT

Now, with reference to the drawings, description is made on a wireless power supply device according to example embodiments of the present invention. Note that, in each example embodiment, description is made on the assumption that a conductive medium is the sea water, but the present invention is not limited thereto. FIG. 7 is a view for illustrating a table in which electric conductivity and relative permittivity of respective media in the present invention are collectively shown. The conductive medium in the present invention may be a substance having electric conductivity of $1 \times 10^{-4}$ S/m or more and relative permittivity higher than 1 such as river water, fresh water, tap water, soil, and concrete, shown in FIG. 7.

First Example Embodiment

Figure 1:
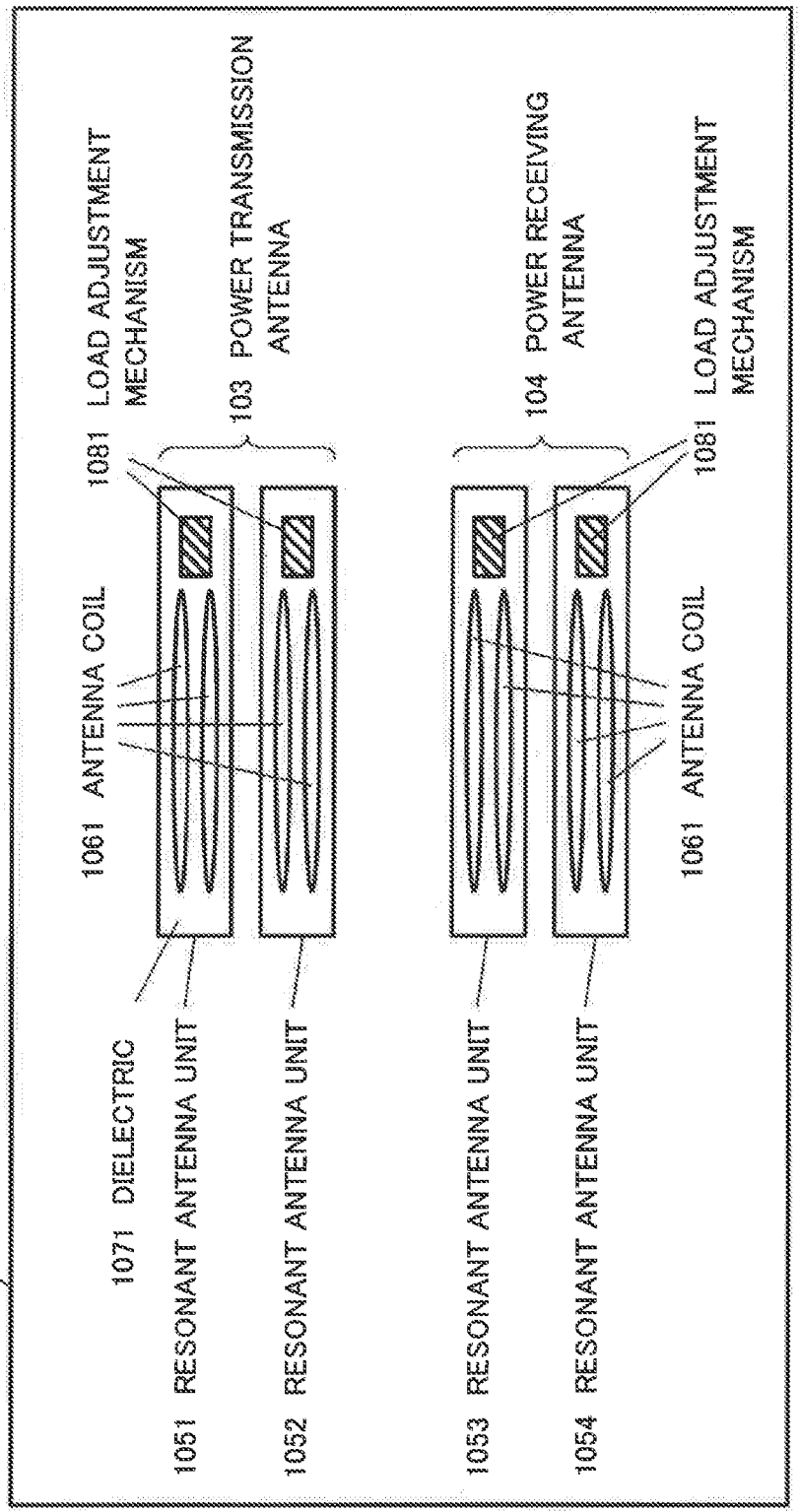
FIG. 1 is a view for illustrating a configuration of a wireless power supply device according to a first example embodiment of the present invention.

Now, with reference to the drawings, description is made on a wireless power supply device according to a first example embodiment of the present invention. FIG. 1 is a view for illustrating a configuration of the wireless power supply device according to the first example embodiment.

As illustrated in FIG. 1, an underwater wireless power supply device 101 includes a power transmission antenna 103 and a power receiving antenna 104. Further, the power transmission antenna 103 and the power receiving antenna 104 are covered with a conductive medium 102 such as sea water. The power transmission antenna 103 wirelessly transmits energy in the medium. The power receiving antenna 104 receives the energy transmitted from the power transmission antenna. The underwater wireless power supply device 101 wirelessly transmits the energy by resonating at a frequency determined by the impedance of the power transmission antenna 103, the impedance of the power receiving antenna 104, and the impedance of the conductive medium 102. Note that, in the following description, an operation of wirelessly transmitting energy is also referred to as a power transmission operation.

The power transmission antenna 103 includes resonant antenna units 1051 and 1052. Further, similarly to the power transmission antenna 103, the power receiving antenna 104 includes resonant antenna units 1053 and 1054.

Each of the resonant antenna units 1051 to 1054 includes two or more antenna coils 1061 and at least one dielectric 1071. The antenna coils 1061 are obtained by winding conductors such as copper wires a plurality of times, and helical coils, spiral coils, or the like are generally used. However, in the present example embodiment, the antenna coils 1061 are not limited thereto. Among the two or more antenna coils arranged in each of the resonant antenna units, at least two antenna coils are insulated from each other, and the dielectric 1071 is arranged between the two antenna coils.

Here, the power transmission antenna may include a function as the power receiving antenna, and the power receiving antenna may include a function as the power transmission antenna. Further, the power transmission antenna and the power receiving antenna may have the similar configuration.

The dielectric 1071 is configured by a dielectric with relative permittivity of approximately from 2 to 10 and dielectric loss tangent of 0.01 or less, such as polyethylene, polyimide, polyamide, fluorocarbon resin, and acrylic, for example.

A load adjustment mechanism 1081 includes a mechanism which adjusts a load of the resonant antenna units in a mechanical, electrical, or another manner and adjusts input impedance or output impedance. Note that, in the present example embodiment, a mode in which each of the resonant antenna units includes the load adjustment mechanism 1081 is described, but the present invention is not limited thereto. A mode in which only a part of the resonant antenna units includes the load adjustment mechanism 1081 is also possible. Further, in the present example embodiment, a mode in which the load adjustment mechanism 1081 is installed inside the resonant antenna unit is described, but the present invention is not limited thereto. The configuration in which a part of or an entirety of the load adjustment mechanism 1081 is installed outside of the resonant antenna unit is also possible.

Note that, in the present example embodiment, there is described the configuration in which the resonant antenna unit 1051 and the resonant antenna unit 1052 forming the power transmission antenna 103 are installed through intermediation of the conductive medium 102, for example, but the present invention is not necessarily limited thereto. It is also possible to have the configuration in which a part of or an entirety of the resonant antenna unit 1051 and a part of or an entirety of the resonant antenna unit 1052 are held in contact with the conductive medium 102. Further, for example, the power transmission antenna 103 may include three or more resonant antenna units.

Further, in the present example embodiment, the state in which the respective resonant antenna units face straightly is described, but the present invention is not necessarily limited thereto. A mode in which the resonant antenna units do not face straightly, that is, to be shifted from a specific axis is also possible.

Next, a specific operation of the underwater wireless power supply device 101 according to the present example embodiment is described step by step.

First, in the power transmission antenna 103, an AC power source (not shown) outputs AC power at a predetermined frequency. Subsequently, the output AC power is supplied from a power transmission end being an input terminal of the power transmission antenna 103 to the antenna coils 1061 in the resonant antenna unit 1051. With a resonance action of the antenna coils in the resonant antenna unit 1051 forming the power transmission antenna 103, the antenna coils 1061 in the resonant antenna unit 1051 send out the AC power as electromagnetic energy to the outside (to the conductive medium 102). Then, the resonant antenna unit 1052 feeds the sent-out electromagnetic energy into the antenna coils 1061 in the resonant antenna unit 1052.

Here, during the above-mentioned power transmission operation, or before or after the power transmission operation, the load adjustment mechanisms 1081 included in the resonant antenna units 1051 and 1052 adjust the impedance of the resonant antenna unit 1051 and the impedance of the resonant antenna unit 1052. With this adjustment, the impedance of the conductive medium 102, the impedance of the resonant antenna unit 1051, and the impedance of the resonant antenna unit 1052 match with each other. Further, the combined impedance of the impedance of the resonant antenna unit 1051, the impedance of the resonant antenna unit 1052, and the impedance of a conductive medium 13 is caused to resonate at the frequency of the transmitted power.

Similarly, with a resonance action of the antenna coils in the resonant antenna unit 1052, the antenna coils 1061 in the resonant antenna unit 1052 send out the AC power as electromagnetic energy to the outside (to the conductive medium 102). Subsequently, the resonant antenna unit 1053 forming the power receiving antenna 104 feeds the sent-out electromagnetic energy into the antenna coils 1061 in the resonant antenna unit 1053. Also in this case, during the power transmission operation, or before or after the power transmission operation, the load adjustment mechanisms 1081 included in the resonant antenna units 1052 and 1053 adjust the impedance of the resonant antenna unit 1052 and the impedance of the resonant antenna unit 1053. With this adjustment, the impedance of the conductive medium 102, the impedance of the resonant antenna unit 1052, and the impedance of the resonant antenna unit 1053 match with each other. Further, the combined impedance of the impedance of the resonant antenna unit 1052, the impedance of the resonant antenna unit 1053, and the impedance of the conductive medium 13 is caused to resonate at the frequency of the transmitted power.

Further, similarly, with a resonance action of the antenna coils in the resonant antenna unit 1053, the antenna coils 1061 in the resonant antenna unit 1053 send out the AC power as electromagnetic energy to the outside (to the conductive medium 102). Subsequently, the resonant antenna unit 1054 feeds the sent-out electromagnetic energy into the antenna coils 1061 in the resonant antenna unit 1054. Also in this case, during the power transmission operation, or before or after the power transmission operation, the load adjustment mechanisms 1081 included in the resonant antenna units 1053 and 1054 adjust the impedance of the resonant antenna unit 1053 and the impedance of the resonant antenna unit 1054. With this adjustment, the impedance of the conductive medium 102, the impedance of the resonant antenna unit 1053, and the impedance of the resonant antenna unit 1054 match with each other. Further, the combined impedance of the impedance of the resonant antenna unit 1053, the impedance of the resonant antenna unit 1054, and the impedance of the conductive medium 13 is caused to resonate at the frequency of the transmitted power.

Finally, the power fed into the antenna coils 1061 in the resonant antenna unit 1054 is supplied to a target load (a battery, for example), and the power transmission is completed.

Note that, in the electromagnetic field passing through the sea water during the power transmission operation, a loss determined by Expression (1) is generated with respect to the power transmission frequency determined by the resonance action of the antenna coils in the power transmission antenna 103 and the resonance action of the antenna coils in the power receiving antenna 104.

As described above, according to the first example embodiment, the power transmission antenna and the power receiving antenna each include four or more antenna coils, and the resonance actions of the antenna coils determine the power transmission frequency. Further, the impedance adjustment mechanisms in any one of or all of the antenna coil ends are provided. With the above-mentioned configuration, even in the case where the magnetic antenna is used for power transmission in the sea water, the impedance matching with the sea water can be facilitated. As a result, high power transmission efficiency can be obtained.

Figure 2:
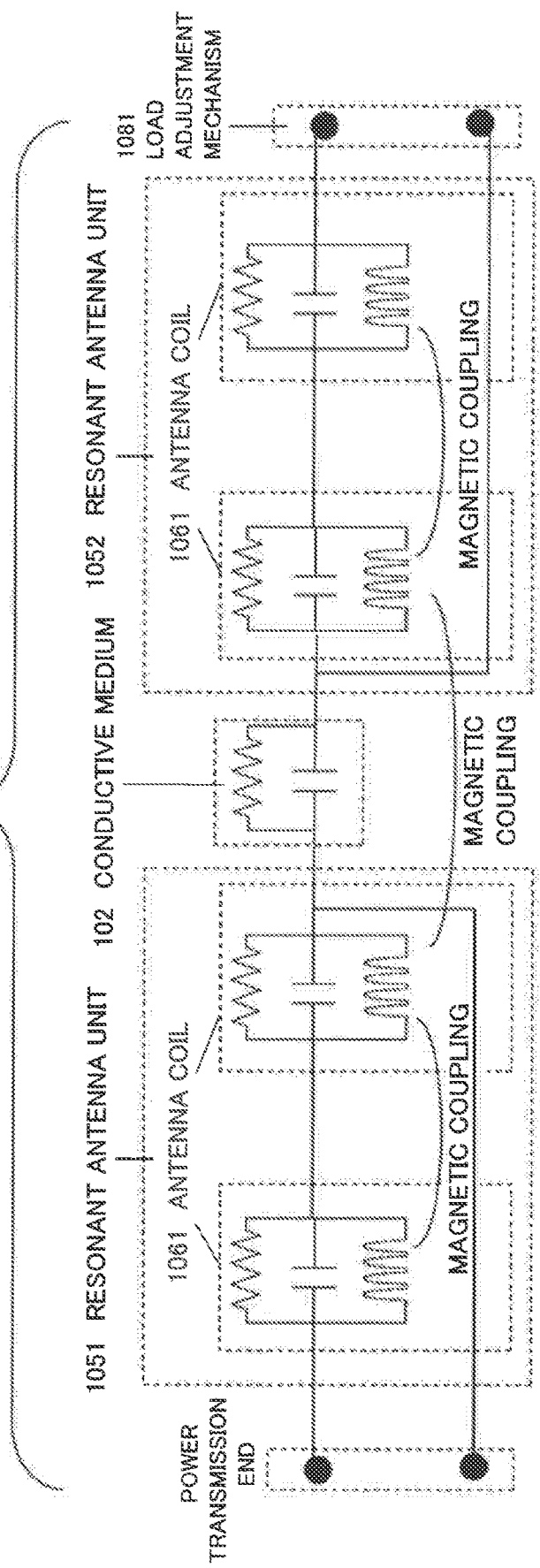
FIG. 2 is an equivalent circuit diagram in a case where wireless power is transmitted from a resonant antenna unit 1051 to a resonant antenna unit 1052 in FIG. 1.

Here, in FIG. 2, there is illustrated an equivalent circuit in a case where the wireless power sent out from the resonant antenna unit 1051 is propagated to the resonant antenna unit 1052. FIG. 2 is an equivalent circuit diagram for the wireless power in the case where the wireless power is propagated from the resonant antenna unit 1051 to the resonant antenna unit 1052.

As illustrated in FIG. 2, the power transmission antenna 103 or the power receiving antenna 104 is formed by four antenna coils 1061, and the respective antenna coils 1061 are configured to resonate through magnetic coupling. In this case, the impedance adjustment result obtained by the load adjustment mechanism 1081 illustrated on the right side of FIG. 2 is transmitted to the power transmission end being an input terminal of the power transmission antenna 103 illustrated on the left side of FIG. 2 through the magnetic coupling. In this manner, the apparent input impedance of the power transmission end is adjusted. In other words, the apparent input impedance at the power transmission end illustrated on the left side of FIG. 2 corresponds to impedance variation caused by the load adjustment mechanism 1081 through the magnetic coupling at a plurality of positions.

According to the present example embodiment, with the function of the above-mentioned load adjustment mechanism 1081, the apparent input impedance at the power transmission end illustrated on the left side of FIG. 2 can easily be variable. For example, the impedance of 50Ω is supplied to the load adjustment mechanism 1081 without loss, and accordingly, the input impedance of the power transmission end illustrated on the left side of FIG. 2 can become close to 50Ω. This can easily be understood because the magnetic coupling is equal to a lossless transmission path. Therefore, when the input impedance is desired to be close to the impedance of the sea water being the conductive medium 102, which is approximately 50Ω, the impedance of 50Ω only needs to be supplied to the load adjustment mechanism 1081. Further, when the input impedance is desired to be close to the impedance of the air, which is approximately 377Ω, the impedance of 377Ω only needs to be supplied to the load adjustment mechanism 1081.

Further, according to the present example embodiment, the impedance adjustment can also be performed by causing the antenna coil 1061 to have a winding number and a size which are different among the respective antenna coils 1061. As is well known, when a high frequency is applied to coils having winding numbers different from each other, that is, a structure generally called a transformer, a voltage and current become variable corresponding to the above-mentioned winding number ratio of the coils and the like. For example, in a case of a transformer having a winding number ratio of 1:2, it is known that a voltage is converted to be double. Based on this principle, when a winding number ratio of the antenna coils is set to 1:2, for example, the voltage of the high frequency passing through the coils is doubled, and the impedance is quadrupled based on the law of conservation of energy.

Further, according to the present example embodiment, even in a mode in which the resonant antenna units 1051 to 1054 do not face straightly, that is, the state of being shifted from a specific axis, the impedance adjustment can be performed. As described above, the apparent impedance of the power transmission end illustrated on the left side of FIG. 2 corresponds to the impedance variation caused by the load adjustment mechanism 1081 through the magnetic coupling at the plurality of positions. A mode in which the resonant antenna units 1051 to 1054 do not face straightly, that is, the state of being shifted from a specific axis, is equal to the variation of the magnetic coupling amounts of the resonant antenna units 1051 to 1054. With this, the apparent input impedance of the power transmission end is influenced by a result of the variation of the magnetic coupling amounts in addition to a result of the impedance adjustment performed by the load adjustment mechanism 1081. Therefore, similarly to the above-mentioned description, the input impedance adjustment can be performed.

Second Example Embodiment

Figure 3:
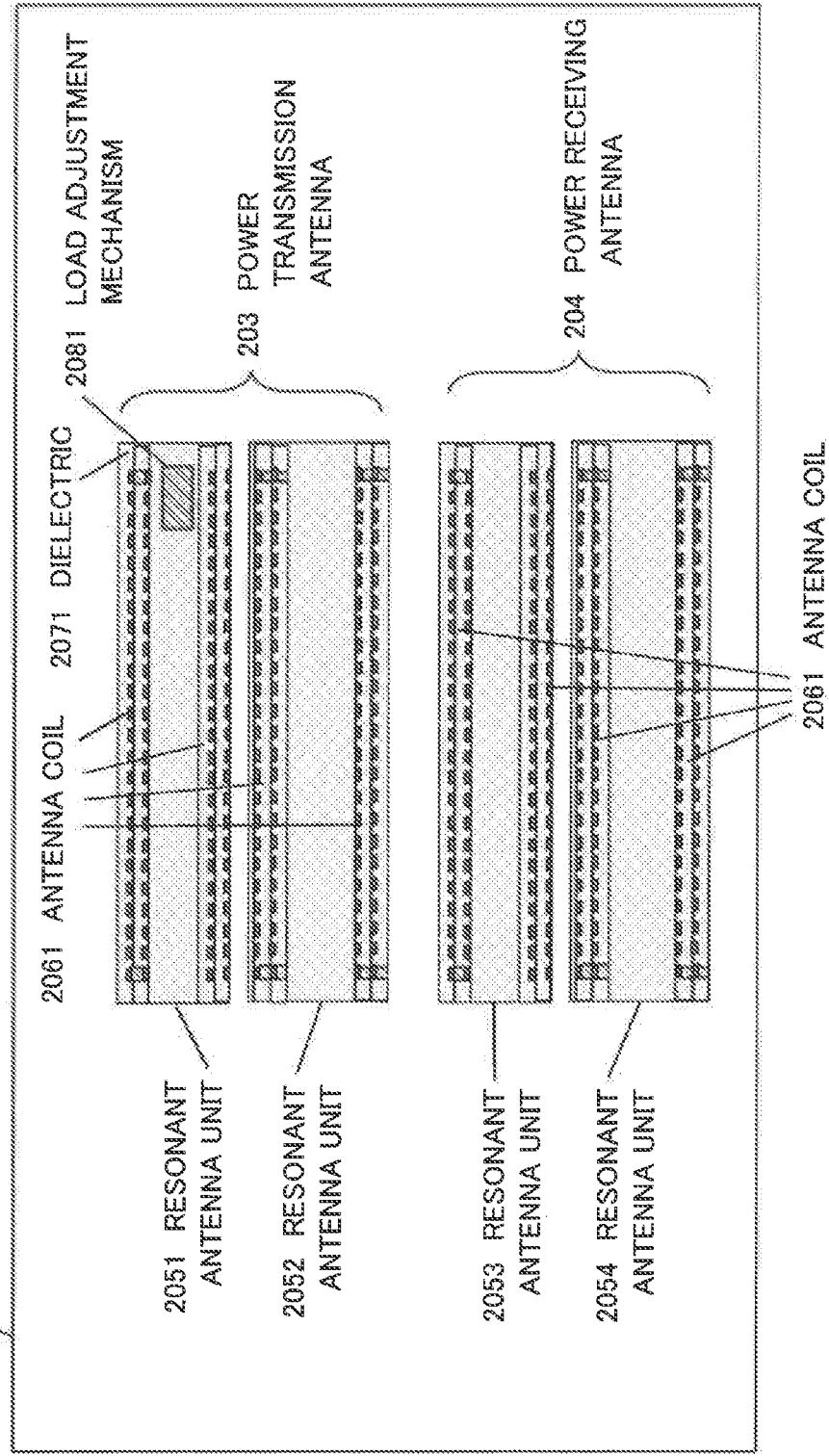
FIG. 3 is a view for illustrating a configuration of a wireless power supply device according to a second example embodiment of the present invention.

Next, with reference to the drawing, description is made on a wireless power supply device according to a second example embodiment. FIG. 3 is a view for illustrating a configuration of the underwater wireless power supply device according to the second example embodiment of the present invention.

As illustrated in FIG. 3, an underwater wireless power supply device 201 according to the present example embodiment includes antenna coils 2061 configured by helical coils, spiral coils, or the like formed by a multi-layer semiconductor process, and the respective layers are connected with each other through a metallic via and the like. Other configurations are similar to those of the first example embodiment, and the underwater wireless power supply device 201 includes a power transmission antenna 203 and a power receiving antenna 204. Further, the power transmission antenna 203 and the power receiving antenna 204 are covered with a conductive medium 202 such as the sea water. The power transmission antenna 203 includes a resonant antenna unit 2051 and a resonant antenna unit 2052. Further, similarly to the power transmission antenna 203, the power receiving antenna 204 includes a resonant antenna unit 2053 and a resonant antenna unit 2054. Each of the resonant antenna units 2051 to 2054 includes two or more antenna coils 2061 and a dielectric 2071. Further, the resonant antenna unit 2051 includes a load adjustment mechanism 2081. At least two antenna coils among the two or more antenna coils arranged in each of the resonant antenna units are insulated from each other.

Also in the present example embodiment, the power transmission antenna may have a function as the power receiving antenna, and the power receiving antenna may have a function as the power transmission antenna. Further, the power transmission antenna and the power receiving antenna may have the similar configuration.

Similarly to the first example embodiment, the dielectric 2071 is configured by a dielectric with relative permittivity of approximately from 2 to 10 and dielectric loss tangent of 0.01 or less, such as polyethylene, polyimide, polyamide, fluorocarbon resin, and acrylic, for example.

Similarly to the first example embodiment, the load adjustment mechanism 2081 includes a mechanism which adjusts a load of the resonant antenna unit 2051 in a mechanical, electrical, or another manner and adjusts the input impedance or the output impedance. Note that, in the present example embodiment, a mode in which the resonant antenna unit 2051 includes the load adjustment mechanism 2081 is described, but the present invention is not limited thereto. A mode in which each of the resonant antenna units 2051 to 2054 includes the load adjustment mechanism 2081 is also possible. Further, in the present example embodiment, a mode in which the load adjustment mechanism 2081 is installed in the resonant antenna unit 2051 is described, but the present invention is not limited thereto. A configuration in which a part of or an entirety of the load adjustment mechanism 2081 is installed outside of the resonant antenna unit 2051 is also possible.

Note that, also in the present example embodiment, there is described the configuration in which the resonant antenna unit 2051 and the resonant antenna unit 2052 forming the power transmission antenna 203 are installed through intermediation of the sea water, for example, but the present invention is not necessarily limited thereto. Part of or an entirety of the resonant antenna unit 2051 and part of or an entirety of the resonant antenna unit 2052 may be held in contact with the sea water. Further, for example, the power transmission antenna 203 may include three or more resonant antenna units.

Further, also in the present example embodiment, the state in which the respective resonant antenna units face straightly is described, but the present invention is not necessarily limited thereto. A mode in which the resonant antenna units do not face straightly, that is, to be shifted from a specific axis is also possible.

Note that, the specific operation of the underwater wireless power supply device 201 according to the second example embodiment is similar to the above-mentioned specific operation in the first example embodiment.

According to the present example embodiment, in addition to the effect of the first example embodiment, the power transmission antenna and the power receiving antenna can be manufactured stably at low cost. The antenna coils forming the power transmission antenna and the power receiving antenna are formed by a material such as copper wires. However, when a common copper wire material is used, flatness and bendability of the copper wire material is not satisfactory, and hence a failure is liable to be caused. With multi-layer wires and use of the semiconductor process, the power transmission antenna and the power receiving antenna can be manufactured stably at low cost.

Third Example Embodiment

Figure 4:
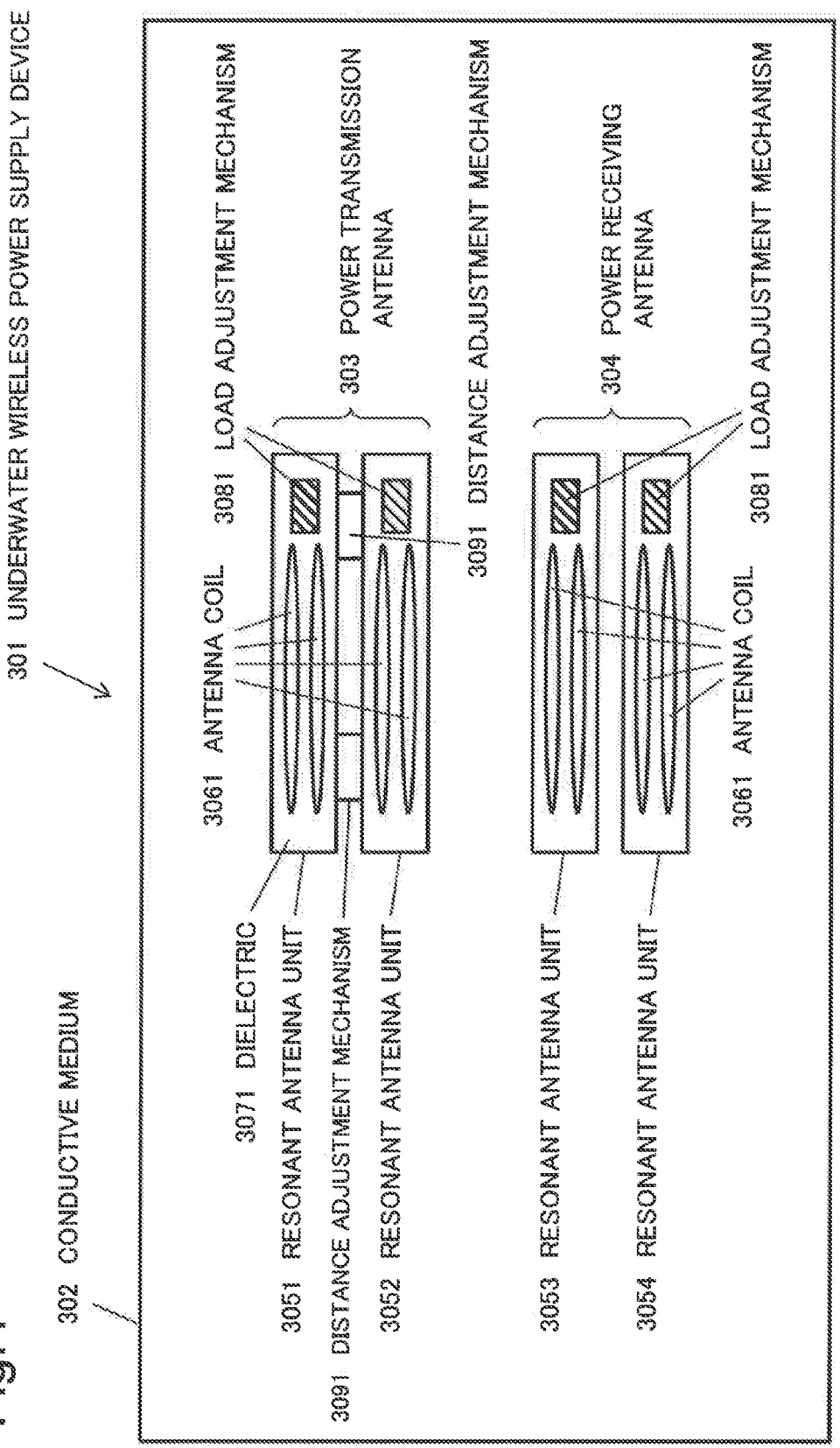
FIG. 4 is a view for illustrating a configuration of a wireless power supply device according to a third example embodiment of the present invention.

Next, with reference to the drawing, description is made on a wireless power supply device according to a third example embodiment. FIG. 4 is a view for illustrating a configuration of the underwater wireless power supply device according to the third example embodiment of the present invention.

As illustrated in FIG. 4, an underwater wireless power supply device 301 according to the present example embodiment is different from the first example embodiment and the second example embodiment in that a power transmission antenna 303 includes a distance adjustment mechanism 3091 having a function of adjusting a distance between a resonant antenna unit 3051 and a resonant antenna unit 3052. Specifically, the distance adjustment mechanism 3091 adjusts the distance between the resonant antenna unit 3051 and the resonant antenna unit 3052 mechanically or by using other mechanisms.

Note that, in the present example embodiment, a mode in which only the power transmission antenna 303 includes the distance adjustment mechanism 3091 is described, but the present invention is not limited thereto. A mode in which a power receiving antenna 304 includes the distance adjustment mechanism 3091 having a function of adjusting a distance between a resonant antenna unit 3053 and a resonant antenna unit 3054 is also possible.

The other configurations are similar to those of the first example embodiment and the second example embodiment, and the underwater wireless power supply device 301 includes the power transmission antenna 303 and the power receiving antenna 304. Further, the power transmission antenna 303 and the power receiving antenna 304 are covered with a conductive medium 302 such as the sea water. The power transmission antenna 303 includes the resonant antenna units 3051 and 3052. Further, similarly to the power transmission antenna 303, the power receiving antenna 304 includes the resonant antenna units 3053 and 3054. Each of the resonant antenna units 3051 to 3054 includes two or more antenna coils 3061, a dielectric 3071, and a load adjustment mechanism 3081. Similarly to the second example embodiment, the antenna coils 3061 may be configured by helical coils, spiral coils, or the like formed by a multi-layer semiconductor process, and the respective layers may be connected with each other through a metallic via hole and the like. At least two antenna coils among the two or more antenna coils arranged in each of the resonant antenna units are insulated from each other.

Also in the present example embodiment, the power transmission antenna 303 may have a function as the power receiving antenna 304, and the power receiving antenna 304 may have a function as the power transmission antenna 303. Further, the power transmission antenna 303 and the power receiving antenna 304 may have the similar configuration.

Similarly to the first example embodiment and the second example embodiment, the dielectric 3071 is configured by a dielectric with relative permittivity of approximately from 2 to 10 and dielectric loss tangent of 0.01 or less, such as polyethylene, polyimide, polyamide, fluorocarbon resin, and acrylic, for example.

Similarly to the first example embodiment and the second example embodiment, the load adjustment mechanism 3081 includes a mechanism which adjusts loads of the resonant antenna units 3051 to 3054 in a mechanical, electrical, or another manner and adjusts the input impedance or the output impedance. Note that, in the present example embodiment, a mode in which each of the resonant antenna units includes the load adjustment mechanism 3081 is described, but the present invention is not limited thereto. A mode in which only a part of the resonant antenna units includes the load adjustment mechanism 3081 is also possible. Further, in the present example embodiment, a mode in which the load adjustment mechanism 3081 is installed in the resonant antenna unit is described, but the present invention is not limited thereto. The configuration in which a part of or an entirety of the load adjustment mechanism 3081 is installed outside of the resonant antenna unit is also possible.

Note that, also in the present example embodiment, there is described the configuration in which the resonant antenna unit 3051 and the resonant antenna unit 3052 forming the power transmission antenna 303 are installed through intermediation of the conductive medium 302, for example, but the present invention is not necessarily limited thereto. It is also possible to have the configuration in which a part of or an entirety of the resonant antenna unit 3051 and a part of or an entirety of the resonant antenna unit 3052 are held in contact with the conductive medium 302. Further, for example, the power transmission antenna 303 may include three or more resonant antenna units.

Further, also in the present example embodiment, the state in which the resonant antenna units 3051 to 3054 face straightly is described, but the present invention is not necessarily limited thereto. A mode in which the resonant antenna units 3051 to 3054 do not face straightly, that is, to be shifted from a specific axis is also possible.

Next, a specific operation of the underwater wireless power supply device 301 according to the third example embodiment is described. The operation of the underwater wireless power supply device 301 according to the present example embodiment is different from the first example embodiment and the second example embodiment in that the impedance adjustment is performed by also using the distance adjustment mechanism 3091 along with the load adjustment mechanism 3081, during the power transmission operation, or before or after the power transmission operation. However, the other configurations are similar to those of the first example embodiment and the second example embodiment.

First, similarly to the first example embodiment and the second example embodiment, in the power transmission antenna 303, an AC power source (not shown) outputs AC power at a predetermined frequency, and the output AC power is supplied to the antenna coils 3061 in the resonant antenna unit 3051. With a resonance action of the antenna coils in the resonant antenna unit 3051 forming the power transmission antenna 303, the antenna coils 3061 in the resonant antenna unit 3051 send out the AC power as electromagnetic energy to the outside (to the conductive medium 302). The resonant antenna unit 3052 feeds the sent-out electromagnetic energy into the antenna coils 3061 in the resonant antenna unit 3052.

Herein, in the present example embodiment, during the power transmission operation from the resonant antenna unit 3051 to the resonant antenna unit 3053, or before or after the power transmission operation, the distance adjustment mechanism 3091 adjusts the distance between the resonant antenna unit 3051 and the resonant antenna unit 3052, and the load adjustment mechanisms 3081 included in the resonant antenna units 3051 and 3052 adjust the loads of the resonant antenna units 3051 and 3052. With this adjustment, the impedance of the conductive medium 102, the impedance of the resonant antenna unit 3051, and the impedance of the antenna unit 3052 match with each other. Further, the combined impedance of the impedance of the resonant antenna unit 3051, the impedance of the resonant antenna unit 3052, and the impedance of the conductive medium 302 is caused to resonate at the frequency of the transmitted power.

Subsequently in the following, similarly to the first example embodiment and the second example embodiment, with a resonance action of the antenna coils in the resonant antenna unit 3052, the antenna coils 3061 in the resonant antenna unit 3052 send out the AC power as electromagnetic energy to the outside (to the conductive medium 302). Then, the resonant antenna unit 3053 forming the power receiving antenna 304 feeds the sent-out electromagnetic energy into the antenna coils 3061 in the resonant antenna unit 3053.

During this power transmission operation, or before or after the power transmission operation, the load adjustment mechanisms 3081 included in the resonant antenna units 3052 and 3053 adjust the loads of the resonant antenna units 3052 and 3053. With this adjustment, the impedance of the conductive medium 102, the impedance of the resonant antenna unit 3052, and the impedance of the resonant antenna unit 3053 match with each other. Further, the combined impedance of the impedance of the resonant antenna unit 3052, the impedance of the resonant antenna unit 3053, and the impedance of the conductive medium 302 is caused to resonate at the frequency of the transmitted power.

Further, with a resonance action of the antenna coils in the resonant antenna unit 3053, the antenna coils 3061 in the resonant antenna unit 3053 send out the AC power as electromagnetic energy to the outside (to the conductive medium 302). Then, the resonant antenna unit 3054 feeds the sent-out electromagnetic energy into the antenna coils 3061 in the resonant antenna unit 3054. Similarly in this case, during the power transmission operation, or before or after the power transmission operation, the load adjustment mechanisms 3081 included in the resonant antenna units 3053 and 3054 adjust loads of the resonant antenna units 3053 and 3054. With this adjustment, the impedance of the conductive medium 102, the impedance of the resonant antenna unit 3053, and the impedance of the resonant antenna unit 3054 match with each other. Further, the combined impedance of the impedance of the resonant antenna unit 3053, the impedance of the resonant antenna unit 3054, and the impedance of the conductive medium 302 is caused to resonate at the frequency of the transmitted power.

Finally, the power fed into the antenna coils 3061 in the resonant antenna unit 3054 is supplied to a target load (a battery, for example), and the power transmission is completed.

According to the present example embodiment, in addition to the effects of the first example embodiment or the second example embodiment, another load adjustment means can be provided. In the first example embodiment or the second example embodiment, description is made assuming a mode in which the input/output end of the antenna includes the load adjustment mechanism. In viewpoint of a system operator, however, it is required to design the system in consideration of various influences of a system cost, convenience, a mechanism size, and the like. On the premise of those factors, in the present example embodiment, the load adjusting function exerted by the distance adjustment between the antennas can be provided.

Fourth Example Embodiment

Figure 5:
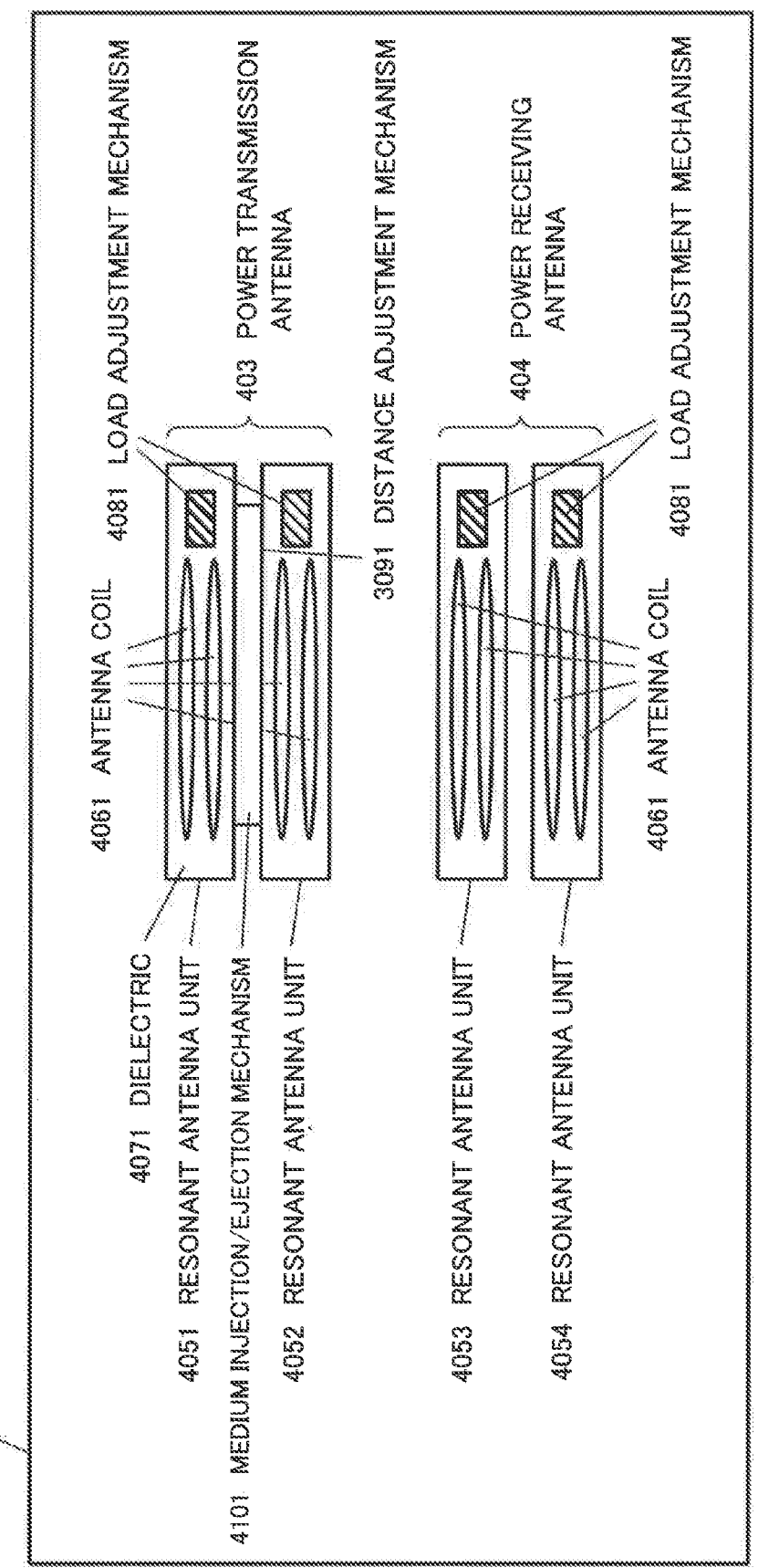
FIG. 5 is a view for illustrating a configuration of a wireless power supply device according to a fourth example embodiment of the present invention.

Next, with reference to the drawings, description is made on a wireless power supply device according to a fourth example embodiment. FIG. 5 is a view for illustrating a configuration of the underwater wireless power supply device according to the fourth example embodiment of the present invention.

As illustrated in FIG. 5, an underwater wireless power supply device 401 according to the present example embodiment is different from the other example embodiments in that a medium injection/ejection mechanism 4101, which has a function of injecting or ejecting a conductive medium 402 such as the sea water, is provided between a resonant antenna unit 4051 and a resonant antenna unit 4052 of a power transmission antenna 403.

Note that, in the present example embodiment, a mode in which only the power transmission antenna 403 includes the medium injection/ejection mechanism is described, but the present invention is not limited thereto. It is also possible to have a mode in which the medium injection/ejection mechanism 4101, which has a function of injecting or ejecting the conductive medium 402, is provided between a resonant antenna unit 4053 and a resonant antenna unit 4054 of a power receiving antenna 404.

The other configurations are similar to those of the first example embodiment to the third example embodiment, and the underwater wireless power supply device 401 includes the power transmission antenna 403 and the power receiving antenna 404. Further, the power transmission antenna 403 and the power receiving antenna 404 are covered with the conductive medium 402 such as the sea water. The power transmission antenna 403 includes the resonant antenna units 4051 and 4052. Further, similarly to the power transmission antenna 403, the power receiving antenna 404 includes the resonant antenna units 4053 and 4054. Each of the resonant antenna units 4051 to 4054 includes two or more antenna coils 4061, a dielectric 4071, and a load adjustment mechanism 4081. Similarly to the second example embodiment, the antenna coils 4061 may be configured by helical coils, spiral coils, or the like formed by a multi-layer semiconductor process, and the respective layers may be connected with each other through a metallic via and the like. At least two antenna coils among the two or more antenna coils arranged in each of the resonant antenna units are insulated from each other.

Also in the present example embodiment, the power transmission antenna 403 may have a function as the power receiving antenna 404, and the power receiving antenna 404 may have a function as the power transmission antenna 403. Further, the power transmission antenna 403 and the power receiving antenna 404 may have the similar configuration.

Similarly to the first example embodiment to the third example embodiment, the dielectric 4071 is configured by a dielectric with relative permittivity of approximately from 2 to 10 and dielectric loss tangent of 0.01 or less, such as polyethylene, polyimide, polyamide, fluorocarbon resin, and acrylic, for example.

Similarly to the first example embodiment to the third example embodiment, the load adjustment mechanism 4081 includes a mechanism which adjusts the loads of the resonant antenna units 4051 to 4054 in a mechanical, electrical, or another manner and adjusts the input impedance or the output impedance. Note that, in the present example embodiment, a mode in which each of the resonant antenna units includes the load adjustment mechanism 4081 is described, but the present invention is not limited thereto. A mode in which only a part of the resonant antenna units includes the load adjustment mechanism 4081 is also possible. Further, in the present example embodiment, a mode in which the load adjustment mechanism 4081 is installed in the resonant antenna unit is described, but the present invention is not limited thereto. The configuration in which a part of or an entirety of the load adjustment mechanism 4081 is installed outside of the resonant antenna unit is also possible.

Note that, also in the present example embodiment, there is described the configuration in which the resonant antenna unit 4051 and the resonant antenna unit 4052 forming the power transmission antenna 403 are installed through intermediation of the conductive medium 402, for example, but the present invention is not necessarily limited thereto. It is also possible to have the configuration in which a part of or an entirety of the resonant antenna unit 4051 and a part of or an entirety of the resonant antenna unit 4052 are held in contact with the conductive medium 402. Further, for example, the power transmission antenna 403 may include three or more resonant antenna units.

Further, also in the present example embodiment, the state in which the resonant antenna units 4051 to 4054 face straightly is described, but the present invention is not necessarily limited thereto. A mode in which the resonant antenna units 4051 to 4054 do not face straightly, that is, to be shifted from a specific axis is also possible.

Next, a specific operation of the underwater wireless power supply device 401 according to the fourth example embodiment is described. The operation of the present example embodiment is different from the other example embodiments in that the impedance adjustment is performed by also using the medium injection/ejection mechanism 4101 along with the load adjustment mechanism 4081, during the power transmission operation from the resonant antenna unit 4051 to the resonant antenna unit 4052 forming the power transmission antenna 403, or before or after the power transmission operation.

First, similarly to the first example embodiment to the third example embodiment, in the power transmission antenna 403, the AC power source (not shown) outputs AC power at a predetermined frequency, and the output AC power is supplied to the antenna coils 4061 in the resonant antenna unit 4051. With a resonance action of the antenna coils in the resonant antenna unit 4051 forming the power transmission antenna 403, the antenna coils 4061 in the resonant antenna unit 4051 send out the AC power as electromagnetic energy to the outside (to the conductive medium 402). The resonant antenna unit 4052 feeds the sent-out electromagnetic energy into the antenna coils 4061 in the resonant antenna unit 4052.

Here, in the present example embodiment, during the power transmission operation from the resonant antenna unit 4051 to the resonant antenna unit 4052, or before or after the power transmission operation, the medium injection/ejection mechanism 4101 injects and ejects the conductive medium 402 between the resonant antenna unit 4051 and the resonant antenna unit 4052. Further, along with this, the load adjustment mechanisms 4081 included in the resonant antenna units 4051 and 4052 adjust the loads of the resonant antenna units 4051 and 4052. With this adjustment, the impedance of the conductive medium 402, the impedance of the resonant antenna unit 4051, and the impedance of the resonant antenna unit 4052 match with each other. Further, the combined impedance of the impedance of the resonant antenna unit 4051, the impedance of the resonant antenna unit 4052, and the impedance of the conductive medium 402 is caused to resonate at the frequency of the transmitted power.

Subsequently in the following, similarly to the first example embodiment to the third example embodiment, with a resonance action of the antenna coils in the resonant antenna unit 4052, the antenna coils 4061 in the resonant antenna unit 4052 send out the AC power as electromagnetic energy to the outside (to the conductive medium 402). Then, the resonant antenna unit 4053 forming the power receiving antenna 404 feeds the sent-out electromagnetic energy into the antenna coils 4061 in the resonant antenna unit 4053.

During this power transmission operation, or before or after the power transmission operation, the load adjustment mechanisms 4081 included in the resonant antenna units 4052 and 4053 adjust the loads of the resonant antenna units 4052 and 4053. With this adjustment, the impedance of the conductive medium 402, the impedance of the resonant antenna unit 4052, and the impedance of the resonant antenna unit 4053 match with each other. Further, the combined impedance of the impedance of the resonant antenna unit 4052, the impedance of the resonant antenna unit 4053, and the impedance of the conductive medium 402 is caused to resonate at the frequency of the transmitted power.

Further, with a resonance action of the antenna coils in the resonant antenna unit 4053, the antenna coils 4061 in the resonant antenna unit 4053 send out the AC power as electromagnetic energy to the outside (to the conductive medium 402). Then, the resonant antenna unit 4054 feeds the sent-out electromagnetic energy into the antenna coils 4061 in the resonant antenna unit 4054. Similarly in this case, during the power transmission operation, or before or after the power transmission operation, the load adjustment mechanisms 4081 included in the resonant antenna units 4053 and 4054 adjust the loads of the resonant antenna units 4052 and 4053. With this adjustment, the impedance of the conductive medium 402, the impedance of the resonant antenna unit 4053, and the impedance of the resonant antenna unit 4054 match with each other. Further, the combined impedance of the impedance of the resonant antenna unit 4053, the impedance of the resonant antenna unit 4054, and the impedance of the conductive medium 402 is caused to resonate at the frequency of the transmitted power.

Finally, the power fed into the antenna coils 4061 in the resonant antenna unit 4054 is supplied to a target load (a battery, for example), and the power transmission is completed.

As described above, according to the present example embodiment, in addition to the effects of the first example embodiment to the third example embodiment, another load adjustment means can further be provided. In the first example embodiment and the second example embodiment, description is made assuming a mode in which the input/output end of the antenna includes the load adjustment mechanism. Further, in the third example embodiment, description is made assuming that the distance adjustment mechanism adjusts the distance between the antennas. In viewpoint of a system operator, however, it is required to design the system in consideration of various influences of a system cost, convenience, a mechanism size, and the like. On the premise of those factors, in the present example embodiment, the load adjusting function exerted by the injection and ejection of the sea water can be provided.

In the above, the description is made on the present invention with reference to the example embodiments. However, the present invention is not limited to the above-mentioned example embodiments. Various changes that can be understood by a person skilled in the art may be made to the configuration and the details of the present invention without departing from the scope of the present invention.

For example, in the fourth example embodiment, it is described that the medium injection/ejection mechanism 4101 adjusts the impedance by injecting or ejecting the sea water between the resonant antenna unit 4051 and the resonant antenna unit 4052 of the power transmission antenna 403. However, the impedance may be adjusted by injecting or ejecting other media such as fresh water in place of the sea water.

APPLICATION EXAMPLES OF THE ABOVE-MENTIONED EXAMPLE EMBODIMENTS

FIG. 6 is a view for illustrating an outline of an application example to which the present invention is applied. The application example described below is an application example to which the first example embodiment is applied, but the other example embodiments may be applied.

FIG. 6 illustrates an application example in which the above-mentioned example embodiment is applied to power supply from a submarine to another submarine as an example. As illustrated in FIG. 6, each of submarines 123 and 124 includes the power transmission antenna 103 and the power receiving antenna 104 in the first example embodiment. First, the submarine 123 approaches the submarine 124 with use of a communication means (not shown), for example. Next, the submarine 123 starts power transmission with use of the power transmission antenna 103. Subsequently, the power receiving antenna 104 included in the submarine 124 receives the power so as to perform charging to a battery or the like (not shown) installed in the submarine 124. Finally, in a case where it is determined that sufficient charging is performed, the submarine 124 issues a command to the submarine 123 with use of a communication means (not shown), for example, and the power transmission antenna 103 stops the operation.

Even when the positional relationship between the submarine 123 and the submarine 124 varies due to occurrence of a tide, stable power supply can be performed by utilizing the above-mentioned example embodiments.

Note that, the submarine 123 and the submarine 124 may use the power transmission antenna 103 as a power receiving antenna and may use the power receiving antenna 104 as a power transmission antenna. Alternatively, the submarine 123 and the submarine 124 may include both the power transmission antenna 103 and the power receiving antenna 104. According to those configurations, mutual power supply can be performed.

Note that, in addition to the power supply from a submarine to another submarine, the present invention may be applied to power supply from a submarine to a sensor device or the like laid in a ship or on the sea floor in a case where a power receiving antenna is provided in the sensor device or the like laid in a ship or on the sea floor.

INDUSTRIAL APPLICABILITY

The present invention is applicable to a wireless power transmission device in a medium such as river water, fresh water, tap water, soil, and concrete, which has electric conductivity of $1 \times 10^{-4}$ S/m or more and relative permittivity higher than 1.

REFERENCE SIGNS LIST

101, 201, 301, 401 Underwater wireless power supply device
102, 202, 302, 402 Conductive medium
103, 203, 303, 403 Power transmission antenna
104, 204, 304, 404 Power receiving antenna
1051, 1052, 1053, 1054 Resonant antenna unit
1061, 2061, 3061, 4061 Antenna coil
1071, 2071, 3071, 4071 Dielectric
1081 Load adjustment mechanism
2051, 2052, 2053, 2054 Resonant antenna unit
3051, 3052, 3053, 3054 Resonant antenna unit
3091 Distance adjustment mechanism
4051, 4052, 4053, 4054 Resonant antenna unit
4101 Medium injection/ejection mechanism
123, 124 Submarine

The invention claimed is:
1. A wireless power supply device, which wirelessly transmits energy by resonating at a frequency determined by impedance of a power transmission antenna configured to wirelessly transmit energy in a medium, impedance of a power receiving antenna configured to receive energy transmitted from the power transmission antenna, and impedance of the medium, wherein
  each of the power transmission antenna and the power receiving antenna includes a plurality of resonant antennas each including both a plurality of antenna coils and at least one dielectric arranged between the plurality of antenna coils, and at least one of the plurality of resonant antennas includes a load adjustment mechanism configured to adjust a load.

2. The wireless power supply device according to claim 1, wherein the load adjustment mechanism includes a mechanism which adjusts input impedance or output impedance of the plurality of resonant antennas in a mechanical or electrical manner.

3. The wireless power supply device according to claim 1, wherein the antenna coil is configured by a helical coil or a spiral coil formed by a semiconductor process.

4. The wireless power supply device according to claim 1, comprising a distance adjustment mechanism configured to adjust a distance between the plurality of resonant antennas.

5. The wireless power supply device according to claim 1, comprising a seawater injection/ejection mechanism configured to inject or eject sea water between the plurality of resonant antennas.

6. The wireless power supply device according to claim 1, wherein the medium has electric conductivity higher than $1\times10^{-4}$ S/m and relative permittivity higher than 1.

7. The wireless power supply device according to claim 1, wherein the medium is any one of sea water, river water, fresh water, tap water, soil, and concrete.

8. The wireless power supply device according to claim 1, wherein the power transmission antenna is mounted on a submarine, the power receiving antenna is mounted on a sensor installed in the sea water, on a ship, or on a submarine, and energy is wirelessly transmitted from the power transmission antenna to the power receiving antenna.

9. A wireless power supply method, in which each of a power transmission antenna configured to wirelessly transmit energy in a medium and a power receiving antenna configured to receive energy transmitted from the power transmission antenna includes a plurality of resonant antennas each including both a plurality of antenna coils and at least one dielectric arranged between the plurality of antenna coils, the wireless power supply method comprising:

adjusting a load of at least one of the plurality of resonant antennas; and wirelessly transmitting energy by resonating at a frequency determined by impedance of the power transmission antenna, impedance of the power receiving antenna, and impedance of the medium.

* * * * *